(12) United States Patent
Kihara et al.

(10) Patent No.: US 10,756,252 B2
(45) Date of Patent: Aug. 25, 2020

(54) PIEZOELECTRIC DEVICE AND ELECTRONIC DEVICE

(71) Applicant: Murata Manufacturing Co., Ltd., Nagaokakyo-shi, Kyoto-fu (JP)

(72) Inventors: Takashi Kihara, Nagaokakyo (JP); Yoshihiro Yamaguchi, Nagaokakyo (JP); Jun Endo, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 585 days.

(21) Appl. No.: 15/695,406

(22) Filed: Sep. 5, 2017

(65) Prior Publication Data

US 2018/0026175 A1 Jan. 25, 2018

Related U.S. Application Data

(63) Continuation of application No. PCT/JP2016/065241, filed on May 24, 2016.

(30) Foreign Application Priority Data

May 29, 2015 (JP) .................. 2015-109321

(51) Int. Cl.
*H01L 41/113* (2006.01)
*H01L 41/053* (2006.01)
(Continued)

(52) U.S. Cl.
CPC ............ *H01L 41/1132* (2013.01); *G06F 3/03* (2013.01); *G06F 3/03545* (2013.01); *H01L 41/047* (2013.01); *H01L 41/053* (2013.01)

(58) Field of Classification Search
CPC ... H01L 41/1132; H01L 41/053; H01L 41/047
(Continued)

(56) References Cited

U.S. PATENT DOCUMENTS

| | | |
|---|---|---|
| 6,791,241 B1 | 9/2004 | Ikegami |
| 7,254,876 B2 | 8/2007 | Ikegami |

(Continued)

FOREIGN PATENT DOCUMENTS

| | | |
|---|---|---|
| JP | 2006-66772 A | 3/2006 |
| JP | 2007-159156 A | 6/2007 |

(Continued)

OTHER PUBLICATIONS

International Search Report issued in International Application No. PCT/JP2016/065241, dated Aug. 16, 2016.
(Continued)

*Primary Examiner* — Derek J Rosenau
(74) *Attorney, Agent, or Firm* — Arent Fox LLP (57) ABSTRACT

An electronic device that includes a housing and a piezoelectric sensor. The piezoelectric sensor is disposed in contact with an inner wall surface of the housing while in a bent state. The piezoelectric sensor includes a piezoelectric film, a coverlay, a first electrode, a second electrode, a third electrode, and a substrate having flexibility. The first electrode is disposed on a surface of the substrate. The first electrode includes a wide part and a narrow part. The coverlay covers a boundary between the wide part and the narrow part. The piezoelectric film covers a boundary between a part of the first electrode which is covered with the coverlay and a part of the first electrode which is not covered with the coverlay.

19 Claims, 7 Drawing Sheets

(51) Int. Cl.
   *G06F 3/0354* (2013.01)
   *G06F 3/03* (2006.01)
   *H01L 41/047* (2006.01)

(58) Field of Classification Search
   USPC .......................................... 310/324, 365, 366
   See application file for complete search history.

(56) References Cited

U.S. PATENT DOCUMENTS

| | | | |
|---|---|---|---|
| 8,004,154 B2* | 8/2011 | Cueff | H01L 41/094 |
| | | | 310/324 |
| 9,635,467 B2 | 4/2017 | Miyoshi et al. | |
| 9,774,958 B2 | 9/2017 | Zaitsu et al. | |
| 2004/0080241 A1 | 4/2004 | Ikegami | |
| 2015/0270472 A1* | 9/2015 | Nagahata | B41J 2/1646 |
| | | | 310/365 |
| 2016/0014527 A1 | 1/2016 | Miyoshi et al. | |
| 2016/0127836 A1 | 5/2016 | Zaitsu et al. | |

FOREIGN PATENT DOCUMENTS

| | | |
|---|---|---|
| JP | 2014-209724 A | 11/2014 |
| WO | WO 2014/192301 A1 | 12/2014 |

OTHER PUBLICATIONS

Written Opinion of the International Searching Authority issued in International Application No. PCT/JP2016/065241, dated Aug. 16, 2016.

* cited by examiner

PIEZOELECTRIC DEVICE AND ELECTRONIC DEVICE

CROSS REFERENCE TO RELATED APPLICATIONS

The present application is a continuation of International application No. PCT/JP2016/065241, filed May 24, 2016, which claims priority to Japanese Patent Application No. 2015-109321, filed May 29, 2015, the entire contents of each of which are incorporated herein by reference.

FIELD OF THE INVENTION

The present invention relates to a piezoelectric device including a substrate having flexibility, and an electronic device including the piezoelectric device.

BACKGROUND OF THE INVENTION

Conventional flexible substrates on which electrodes are disposed have been widely used in piezoelectric devices. Examples of such a substrate include a flexible printed wiring board as disclosed in Patent Document 1. Such a flexible printed wiring board is provided with an electrode thereon including a wide part and a narrow part. The flexible printed wiring board is attached to the housing of an electronic device while being bent. Thus, in the flexible printed wiring board, a bending load is likely to be applied at the boundary between the wide and narrow parts of the electrode and likely to generate cracks.

To avoid this, in the flexible printed wiring board disclosed in Patent Document 1, the boundary is covered and reinforced with a coverlay. With this configuration, generation of cracks is suppressed at the boundary between the wide and narrow parts of the electrode in the flexible printed wiring board disclosed in Patent Document 1.

Patent Document 1: Japanese Patent Application Laid-Open No. 2006-66772

SUMMARY OF THE INVENTION

However, in the flexible printed wiring board disclosed in Patent Document 1, another bending load is likely to be applied at the boundary between a covered part of the electrode, which is covered with the coverlay, and an exposed part of the electrode, which is not covered with the coverlay. Accordingly, in the flexible printed wiring board disclosed in Patent Document 1, cracks are likely to generate at the boundary between the covered part of the electrode, which is covered with the coverlay, and the exposed part of the electrode, which is not covered with the coverlay.

Thus, the present invention is intended to provide a piezoelectric device and an electronic device that achieve a reduction of a bending load applied on an electrode due to the bending of a flexible substrate.

A piezoelectric device according to the present invention includes a piezoelectric film, a substrate, a first electrode, a second electrode, and a covering member. The piezoelectric film includes a first principal surface and a second principal surface. The substrate has flexibility.

The first electrode includes a first wide part connected with the first principal surface of the piezoelectric film, and a first narrow part connected with the first wide part. The first electrode is provided on the substrate. The second electrode is connected with the second principal surface of the piezoelectric film.

The covering member covers a first boundary between the first wide part and the first narrow part. The piezoelectric film covers a second boundary between a first part of the first electrode which is covered with the covering member and a second part of the first electrode which is not covered with the covering member.

The covering member covers the first boundary between the first wide part and the first narrow part. Accordingly, the covering member reinforces the first boundary, thereby suppressing crack generation at the first boundary.

The piezoelectric film covers the second boundary between the first part of the first electrode which is covered with the covering member and the second part of the first electrode which is not covered with the covering member. Accordingly, the piezoelectric film reinforces the second boundary, thereby suppressing crack generation at the second boundary.

Thus, the piezoelectric device can suppress crack generation at the first and second boundaries. Accordingly, the piezoelectric device achieves reduction of the bending load applied on the electrode due to bending of the substrate.

In the present invention, it is preferable that the piezoelectric film further covers the first boundary.

With this configuration, the piezoelectric film further reinforces the first boundary. Thus, the piezoelectric film can further suppress crack generation at the first boundary. Accordingly, the piezoelectric device achieves further reduction of the bending load applied on the electrode due to bending of the substrate.

It is preferable that the piezoelectric device according to the present invention includes a third electrode provided on the substrate and including a second wide part connected with the second electrode and a second narrow part connected with the second wide part. It is also preferable that the covering member covers a third boundary between the second wide part and the second narrow part, and the second electrode covers a fourth boundary between a first part of the third electrode which is covered with the covering member and a second part of the third electrode which is not covered with the covering member.

With this configuration, the covering member covers the third boundary between the second wide part and the second narrow part. Accordingly, the covering member reinforces the third boundary, thereby suppressing crack generation at the third boundary.

The second electrode covers the fourth boundary between the first part of the third electrode which is covered with the covering member and the second part of the third electrode which is not covered with the covering member. Accordingly, the second electrode reinforces the fourth boundary, thereby suppressing crack generation at the fourth boundary.

Thus, the piezoelectric device can suppress crack generation at the third and fourth boundaries. Accordingly, the piezoelectric device achieves reduction of the bending load applied on the electrode due to bending of the substrate.

In the present invention, it is preferable that the second electrode further covers the third boundary.

With this configuration, the second electrode further reinforces the third boundary. Thus, the second electrode can further suppress crack generation at the third boundary. Accordingly, the piezoelectric device achieves further reduction of the bending load applied on the electrode due to bending of the substrate.

An electronic device according to the present invention includes a tubular housing and the piezoelectric device described above. The substrate is mounted on an inner wall surface of the housing while being bent. With this configuration, a bending load due to the bending of the substrate is applied to the piezoelectric device described above.

The electronic device thus configured includes the piezoelectric device described above, and thus achieves an effect same as that achieved by the piezoelectric device described above.

DETAILED DESCRIPTION OF PREFERRED EMBODIMENTS OF THE INVENTION

Figure 1:
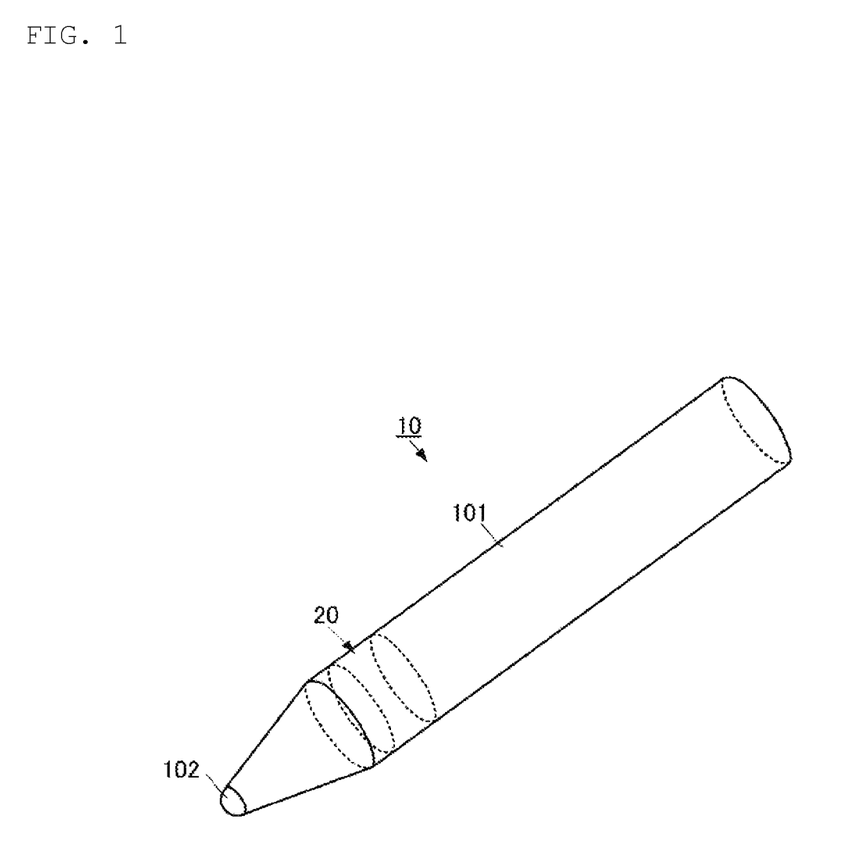
FIG. 1 is a perspective view of an electronic pen 10 according to an embodiment of the present invention.
Figure 2:
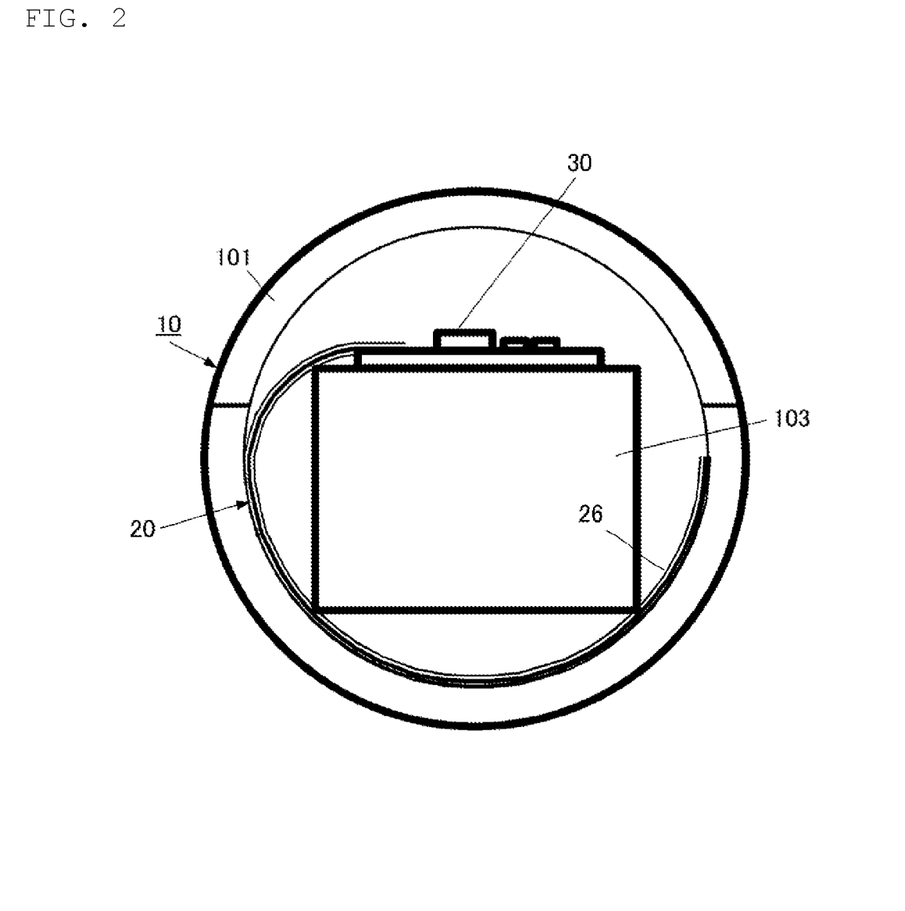
FIG. 2 is a cross-sectional view of the electronic pen 10 illustrated in FIG. 1.
Figure 3:
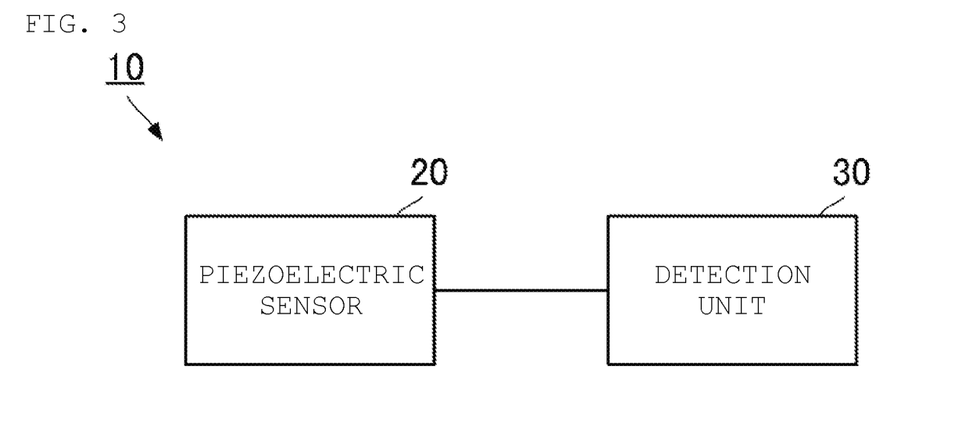
FIG. 3 is a functional block diagram of the electronic pen 10 illustrated in FIG. 1.

The following describes an embodiment of the present invention as configured as an electronic pen with reference to the accompanying drawings. FIG. 1 is a perspective view of an electronic pen 10 according to the embodiment of the present invention. FIG. 2 is a cross-sectional view of the electronic pen 10 illustrated in FIG. 1. FIG. 2 illustrates a cross section of a region in which a piezoelectric sensor 20 is mounted in the electronic pen 10. FIG. 3 is a functional block diagram of the electronic pen 10 illustrated in FIG. 1.

As illustrated in FIG. 1, the electronic pen 10 includes the piezoelectric sensor 20 and a housing 101. As illustrated in FIGS. 2 and 3, the electronic pen 10 further includes a detection unit 30.

The electronic pen 10 corresponds to an exemplary electronic device according to the present invention. The piezoelectric sensor 20 corresponds to an exemplary piezoelectric device according to the present invention.

The housing 101 has a cylindrical shape. The housing 101 is made of an insulating material. As illustrated in FIG. 2, a column 103 is provided inside the housing 101. As illustrated in FIG. 1, a tapered end part 102 is provided at an end of the housing 101 in a longitudinal direction (orthogonal to a circumferential direction) thereof.

The housing 101 needs to have strength (stiffness) enough to transfer deformation thereof to the piezoelectric sensor 20, and may be made of metal.

The piezoelectric sensor 20 includes a substrate 26 having flexibility. As illustrated in FIG. 2, the substrate 26 is mounted on the inner wall surface of the housing 101 while being bent along an inner wall surface of the housing 101 in the circumferential direction. Thus, a bending load due to the bending of the substrate 26 is applied along the piezoelectric sensor 20.

The piezoelectric sensor 20 is connected with the detection unit 30. The detection unit 30 is mounted on the column 103. The detection unit 30 detects output voltage from the piezoelectric sensor 20 to detect whether the housing 101 is held by a user.

The following describes the piezoelectric sensor 20 in detail.

Figure 4:
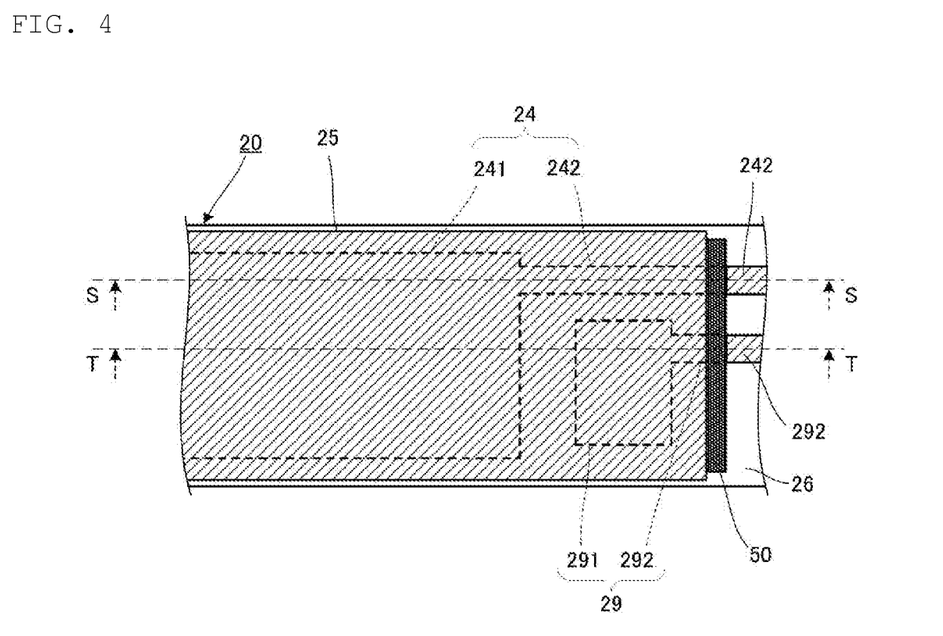
FIG. 4 is a plan view of a piezoelectric sensor 20 illustrated in FIG. 2.
Figure 5:
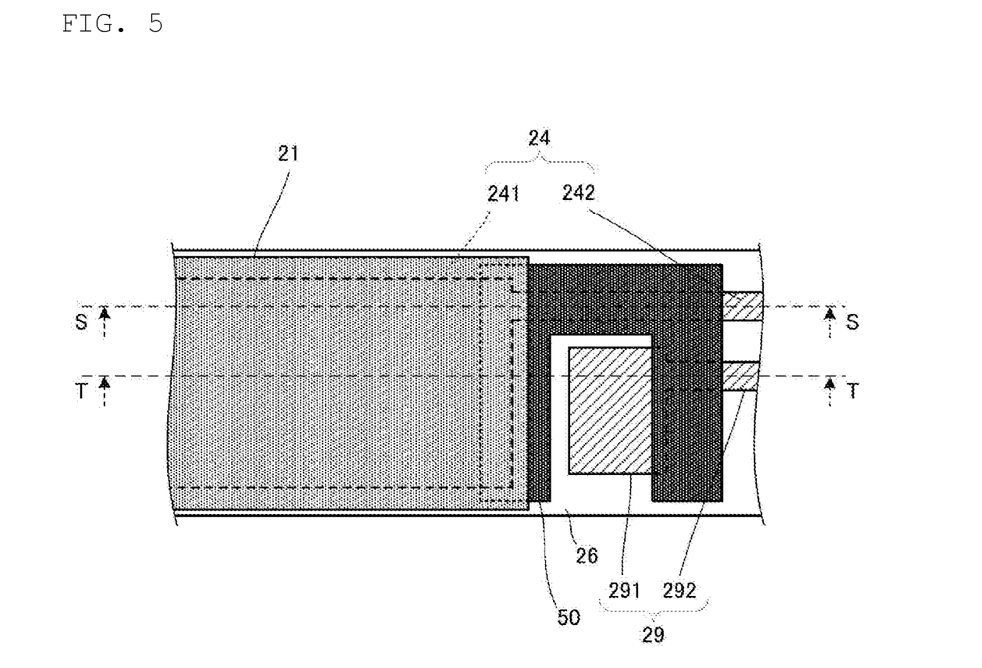
FIG. 5 is a plan view of the piezoelectric sensor 20 in a state in which a second electrode 25 is removed from the piezoelectric sensor 20 illustrated in FIG. 4.
Figure 6:
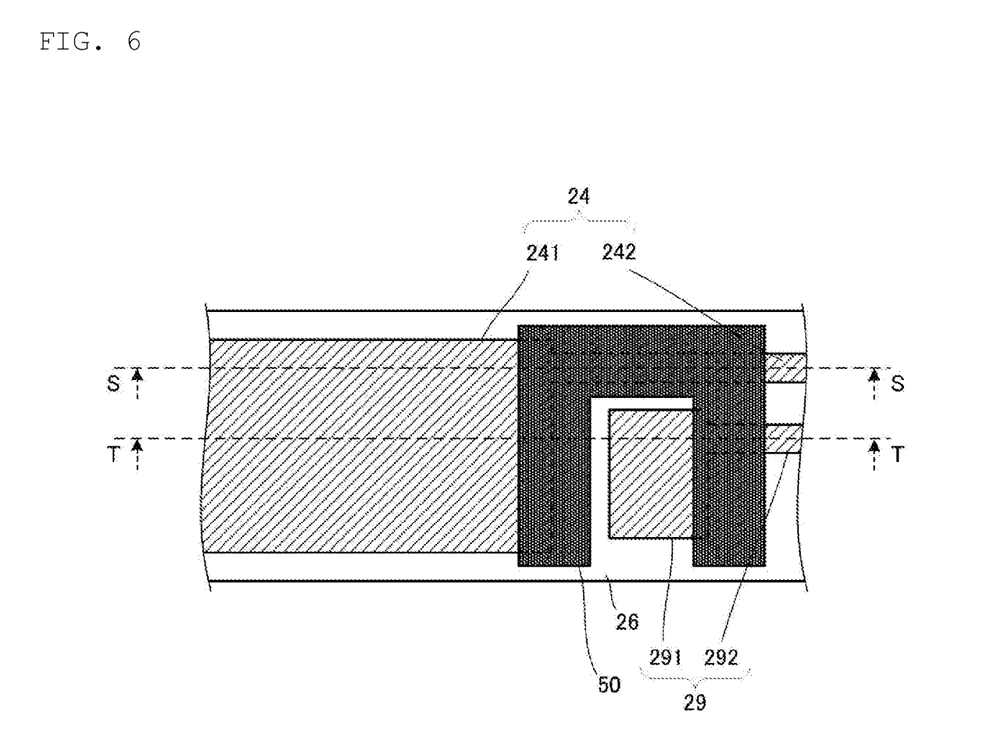
FIG. 6 is a plan view of the piezoelectric sensor 20 in a state in which a piezoelectric film 21 is removed from the state illustrated in FIG. 5.
Figure 7:
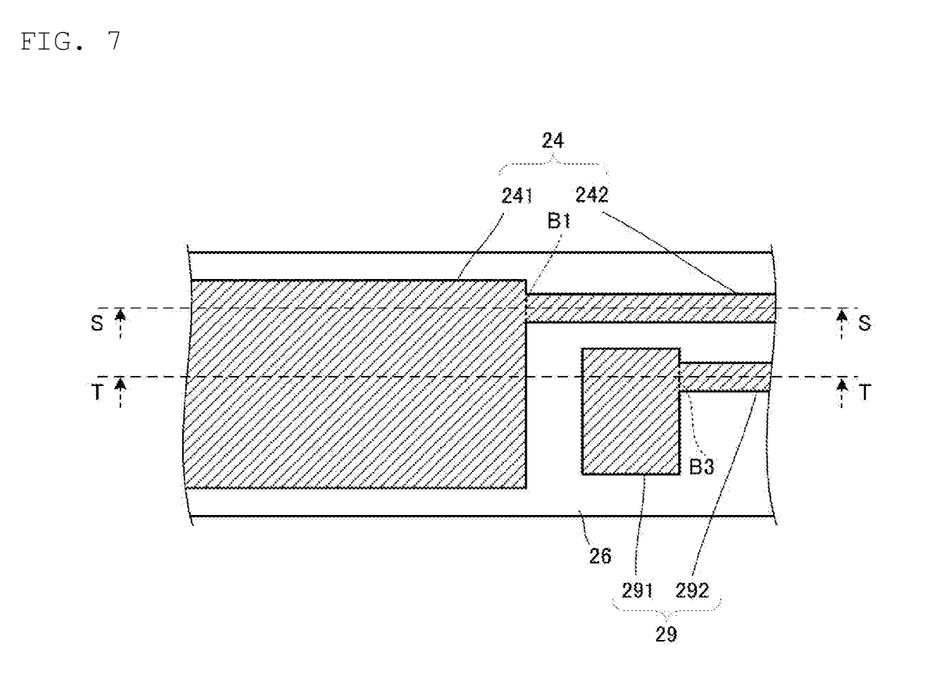
FIG. 7 is a plan view of the piezoelectric sensor 20 in a state in which a coverlay 50 is removed from the state illustrated in FIG. 6.
Figure 8:
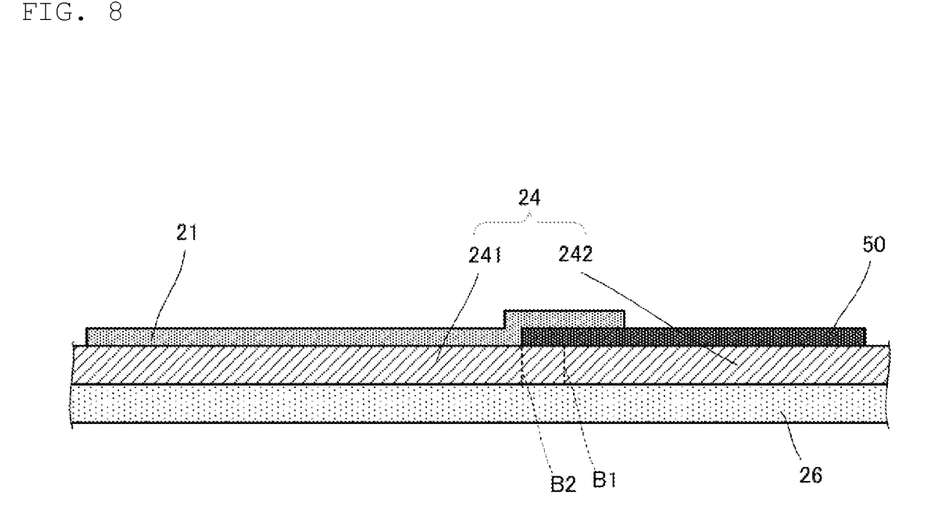
FIG. 8 is a cross-sectional view taken along line S-S in FIG. 5.
Figure 9:
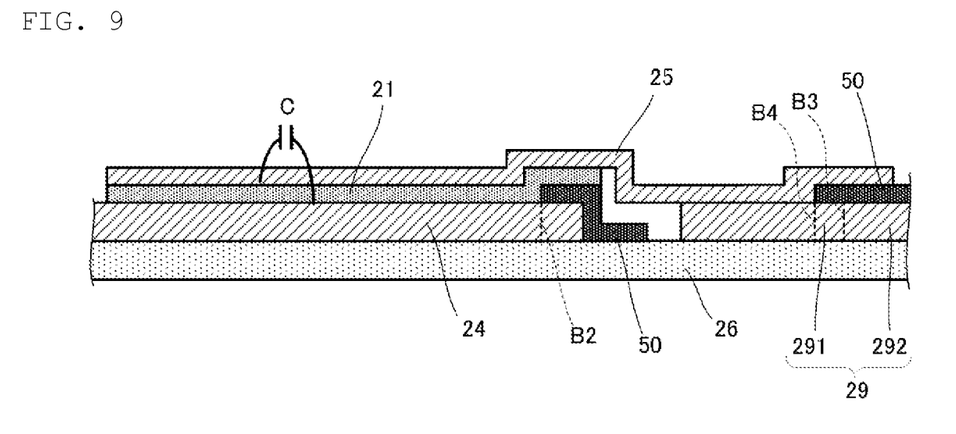
FIG. 9 is a cross-sectional view taken along line T-T in FIG. 4.

FIG. 4 is a plan view of the piezoelectric sensor 20 illustrated in FIG. 2. FIG. 5 is a plan view of the piezoelectric sensor 20 in a state in which a second electrode 25 is removed from the piezoelectric sensor 20 illustrated in FIG. 4. FIG. 6 is a plan view of the piezoelectric sensor 20 in a state in which a piezoelectric film 21 is removed from the state illustrated in FIG. 5. FIG. 7 is a plan view of the piezoelectric sensor 20 in a state in which a coverlay 50 is removed from the state illustrated in FIG. 6. FIG. 8 is a cross-sectional view taken along line S-S in FIG. 5. FIG. 9 is a cross-sectional view taken along line T-T in FIG. 4. FIGS. 4 to 9 illustrate states in which the piezoelectric sensor 20 being bent in FIG. 2 is placed flat.

The piezoelectric sensor 20 includes the piezoelectric film 21, the coverlay 50, a first electrode 24, the second electrode 25, a third electrode 29, and the substrate 26.

The substrate 26 has flexibility. The substrate 26 is made of, for example, polyimide resin. The first electrode 24 and the third electrode 29 are disposed on a surface of the substrate 26. The substrate 26, the first electrode 24, and the third electrode 29 serve as a flexible printed wiring board as illustrated in FIG. 7. The first electrode 24, the second electrode 25, and the third electrode 29 are each formed of a metal film such as copper foil.

The piezoelectric film 21 includes a first principal surface and a second principal surface. The first electrode 24 includes a wide part 241 connected with the first principal surface of the piezoelectric film 21, and a narrow part 242 connected with the wide part 241. The wide part 241 is bonded to the first principal surface of the piezoelectric film 21 with an adhesive (not illustrated) interposed therebetween.

The second electrode 25 is bonded to the second principal surface of the piezoelectric film 21 with an adhesive (not illustrated) interposed therebetween. The third electrode 29 includes a wide part 291 connected with the second electrode 25, and a narrow part 292 connected with the wide part 291.

The first electrode 24 and the third electrode 29 are electrically connected with the detection unit 30.

As illustrated in FIG. 8, the coverlay 50 covers a boundary B1 between the wide part 241 and the narrow part 242. As illustrated in FIG. 9, the coverlay 50 covers a boundary B3 between the wide part 291 and the narrow part 292. The coverlay 50 is made of, for example, PET resin, polyimide resin, or resist. The resist provides high dimensional accuracy and position accuracy and thus is advantageous for downsizing and space saving. The resist allows easy thickness adjustment as compared to the coverlay, thereby facilitating change in designing.

The coverlay 50 corresponds to an exemplary covering member according to the present description. The boundary B1 corresponds to an exemplary first boundary according to the present description. A boundary B2 corresponds to an exemplary second boundary according to the present description. The boundary B3 corresponds to an exemplary third boundary according to the present description. A boundary B4 corresponds to an exemplary fourth boundary according to the present description.

The piezoelectric film 21 is made of poly-L-lactic acid (PLLA). PLLA is chiral polymer, the main chain of which has a helical structure. PLLA is uniaxially stretched to have piezoelectricity due to molecule orientation. The uniaxially stretched PLLA has an extremely high piezoelectric constant among polymers.

PLLA achieves piezoelectricity through molecule orientation treatment such as stretching, and thus does not need to be provided with a poling treatment, which is needed for other polymers such as polyvinylidene fluoride (PVDF) and piezoelectric ceramics. In other words, the piezoelectricity of PLLA, which is not ferroelectric, is attributable to the characteristic helical molecular structure, but not to ionic polarization, unlike ferroelectrics such as PVDF and lead zirconate titanate (PZT).

Thus, PLLA does not have pyroelectricity unlike other ferroelectric piezoelectric bodies. In addition, the piezoelectric constant of PLLA is temporarily extremely stable whereas, for example, the piezoelectric constant of PVDF temporarily varies and significantly decreases in some cases.

When the stretching direction of PLLA is taken to be a third axis and directions orthogonal to the third axis are taken to be first and second axes, PLLA has a piezoelectric constant $d_{14}$ (shearing piezoelectric constant). The piezoelectric film 21 is cut into such a stripe shape that a thickness direction is in the direction of the first axis and a longitudinal direction is in a direction angled at 45° relative to the direction of the third axis (stretching direction). Accordingly, the piezoelectric film 21 is polarized in the thickness direction through expansion and contraction in the longitudinal direction.

With the above-described configuration, the coverlay 50 covers the boundary B1 between the wide part 241 and the narrow part 242 as illustrated in FIG. 8. Accordingly, the coverlay 50 reinforces the boundary B1, thereby suppressing crack generation at the boundary B1.

As illustrated in FIG. 8, the piezoelectric film 21 covers the boundary B2 between a first part of the first electrode 24 which is covered with the coverlay 50 and a second part of the first electrode 24 which is not covered with the coverlay 50. Accordingly, the piezoelectric film 21 reinforces the boundary B2, thereby suppressing crack generation at the boundary B2.

Thus, the piezoelectric sensor 20 can suppress crack generation at the boundary B1 and the boundary B2. Accordingly, the piezoelectric sensor 20 achieves reduction of bending loads applied at the boundary B1 and the boundary B2 due to the bending of the substrate 26.

If the piezoelectric film 21 is bonded not to cover the boundary B1 unlike the state illustrated in FIG. 8, the bending load at the boundary B2 would be reduced but potentially applied at the boundary B1 where a bending load is likely to be applied. For this reason, it is preferable that the piezoelectric film 21 further covers the boundary B1 between the wide part 241 and the narrow part 242.

The coverlay 50 covers the boundary B3 between the wide part 291 and the narrow part 292 as illustrated in FIG. 9. Accordingly, the coverlay 50 reinforces the boundary B3, thereby suppressing crack generation at the boundary B3.

As illustrated in FIG. 9, the second electrode 25 covers the boundary B4 between a first part of the third electrode 29 which is covered with the coverlay 50 and a second part of the third electrode 29 which is not covered with the coverlay 50. Accordingly, the second electrode 25 reinforces the boundary B4, thereby suppressing crack generation at the boundary B4.

Thus, the piezoelectric sensor 20 can suppress crack generation at the boundary B3 and the boundary B4. Accordingly, the piezoelectric sensor 20 achieves reduction of bending loads applied at the boundary B3 and the boundary B4 due to the bending of the substrate 26.

If the piezoelectric film 21 is bonded not to cover the boundary B3 unlike the state illustrated in FIG. 9, the bending load at the boundary B4 would be reduced but potentially applied at the boundary B3 where a bending load is likely to be applied. For this reason, it is preferable that the second electrode 25 further covers the boundary B3 between the wide part 291 and the narrow part 292.

As illustrated in FIGS. 5 and 8, the piezoelectric film 21 has an area larger than the area of the wide part 241 of the electrode 24. This relation prevents such a problem that the boundary B1 and the boundary B2 are not covered by the piezoelectric film 21 due to error in bonding of the piezoelectric film 21 at manufacturing of the piezoelectric sensor 20.

When the first electrode 24 and the second electrode 25 form a capacitor C as illustrated in FIG. 9, variation in the capacitance of the capacitor C due to error in bonding of the piezoelectric film 21 occurs where an electrode width is small. Thus, the piezoelectric sensor 20 can have reduced variation in the capacitor C.

Although the electronic pen 10 is described as an exemplary electronic device in which a substrate is mounted on a housing while being bent in the above-described embodiment, the present invention is not limited thereto. In another embodiment, the present invention is applicable to any other electronic devices such as a mouse, a tablet terminal, and a smartphone.

Although the piezoelectric sensor 20 is described as an exemplary piezoelectric device in the above-described embodiment, the present invention is not limited thereto. In another embodiment, the present invention is applicable to a piezoelectric actuator as an exemplary piezoelectric device.

Although the detection unit 30 is mounted inside the housing 101 as illustrated in FIG. 2, the present invention is not limited thereto. In another embodiment, the detection unit 30 may be provided outside the housing 101. When provided outside the housing 101, the detection unit 30 may be connected with the piezoelectric sensor 20 in a wired or wireless manner.

Although the piezoelectric sensor 20 includes the piezoelectric film 21 made of polylactic acid in the above-described embodiment, the present invention is not limited thereto. In another embodiment, the piezoelectric sensor 20 may include another piezoelectric film made of, for example, PVDF.

For example, a ground electrode may be disposed on a back surface of the substrate 26. In this case, the ground electrode covers both principal surfaces of the first electrode, which leads to reduction of influence of external noise.

The above description of the embodiments is merely exemplary in any way and not intended to limit the invention. The scope of the present invention is defined by the claims but not by the above-described embodiments. Any equivalents of the claims are included in the scope of the present invention.

DESCRIPTION OF REFERENCE SYMBOLS

10: electronic pen
20: piezoelectric sensor
21: piezoelectric film

24: first electrode
25: second electrode
26: substrate
29: third electrode
30: detection unit
50: coverlay
101: housing
102: end part
103: column
241: wide part
242: narrow part
291: wide part
292: narrow part

The invention claimed is:

1. A piezoelectric device comprising:
a piezoelectric film including a first principal surface and a second principal surface;
a substrate having flexibility;
a first electrode on the substrate, the first electrode including a first wide part and a first narrow part connected with the first wide part;
a covering member covering a first boundary between the first wide part and the first narrow part of the first electrode;
a piezoelectric film including a first principal surface and a second principal surface, the first principal surface connected with the first wide part of the first electrode, the piezoelectric film covering a second boundary between a first part of the first electrode which is covered with the covering member and a second part of the first electrode which is not covered with the covering member; and
a second electrode connected with the second principal surface of the piezoelectric film.

2. The piezoelectric device according to claim 1, wherein the piezoelectric film also covers the first boundary.

3. The piezoelectric device according to claim 2, further comprising a third electrode on the substrate, the third electrode including a second wide part connected with the second electrode, and a second narrow part connected with the second wide part, wherein
the covering member covers a third boundary between the second wide part and the second narrow part, and
the second electrode covers a fourth boundary between a first part of the third electrode which is covered with the covering member and a second part of the third electrode which is not covered with the covering member.

4. The piezoelectric device according to claim 3, wherein the second electrode also covers the third boundary.

5. The piezoelectric device according to claim 1, further comprising a third electrode on the substrate, the third electrode including a second wide part connected with the second electrode, and a second narrow part connected with the second wide part, wherein
the covering member covers a third boundary between the second wide part and the second narrow part, and
the second electrode covers a fourth boundary between a first part of the third electrode which is covered with the covering member and a second part of the third electrode which is not covered with the covering member.

6. The piezoelectric device according to claim 5, wherein the second electrode also covers the third boundary.

7. The piezoelectric device according to claim 1, wherein the covering member comprises one of a PET resin, a polyimide resin, and a resist.

8. The piezoelectric device according to claim 1, wherein the piezoelectric film comprises poly-L-lactic acid.

9. The piezoelectric device according to claim 1, wherein the piezoelectric film has an area that is larger than an area of the wide part of the first electrode.

10. An electronic device comprising:
a housing; and
the piezoelectric device according to claim 1,
wherein the substrate is mounted on an inner wall surface of the housing in a bent state.

11. The electronic device according to claim 10, wherein the housing is tubular.

12. The electronic device according to claim 9, wherein the piezoelectric film also covers the first boundary.

13. The electronic device according to claim 12, further comprising a third electrode on the substrate, the third electrode including a second wide part connected with the second electrode, and a second narrow part connected with the second wide part, wherein
the covering member covers a third boundary between the second wide part and the second narrow part, and
the second electrode covers a fourth boundary between a first part of the third electrode which is covered with the covering member and a second part of the third electrode which is not covered with the covering member.

14. The electronic device according to claim 13, wherein the second electrode also covers the third boundary.

15. The electronic device according to claim 9, further comprising a third electrode on the substrate, the third electrode including a second wide part connected with the second electrode, and a second narrow part connected with the second wide part, wherein
the covering member covers a third boundary between the second wide part and the second narrow part, and
the second electrode covers a fourth boundary between a first part of the third electrode which is covered with the covering member and a second part of the third electrode which is not covered with the covering member.

16. The electronic device according to claim 15, wherein the second electrode also covers the third boundary.

17. The electronic device according to claim 9, wherein the covering member comprises one of a PET resin, a polyimide resin, and a resist.

18. The electronic device according to claim 9, wherein the piezoelectric film comprises poly-L-lactic acid.

19. The electronic device according to claim 9, wherein the piezoelectric film has an area that is larger than an area of the wide part of the first electrode.

* * * * *